(12) United States Patent
Pascal et al.

(10) Patent No.: US 9,507,006 B2
(45) Date of Patent: Nov. 29, 2016

(54) METHOD FOR CALIBRATING A CURRENT TRANSDUCER OF THE ROGOWSKI TYPE

(71) Applicant: ABB TECHNOLOGY AG, Zürich (CH)

(72) Inventors: Joris Pascal, Baden (CH); Rolf Disselnkötter, Mauer (DE); Franz Zurfluh, Brugg (CH); Bernhard Deck, Weilheim (DE)

(73) Assignee: ABB Schweiz AG, Baden (CH)

( * ) Notice: Subject to any disclaimer, the term of this patent is extended or adjusted under 35 U.S.C. 154(b) by 228 days.

(21) Appl. No.: 14/512,736

(22) Filed: Oct. 13, 2014

(65) Prior Publication Data

US 2015/0028850 A1    Jan. 29, 2015

Related U.S. Application Data

(63) Continuation of application No. PCT/EP2013/001133, filed on Apr. 17, 2013.

(30) Foreign Application Priority Data

Apr. 20, 2012  (EP) .................................. 12002766
Apr. 20, 2012  (EP) .................................. 12002767
May 29, 2012  (EP) .................................. 12004124

(51) Int. Cl.
*G01R 35/00* (2006.01)
*G01R 15/18* (2006.01)
*G01R 19/00* (2006.01)

(52) U.S. Cl.
CPC .......... *G01R 35/005* (2013.01); *G01R 15/181* (2013.01); *G01R 19/0092* (2013.01)

(58) Field of Classification Search
CPC combination set(s) only.
See application file for complete search history.

(56) References Cited

U.S. PATENT DOCUMENTS

| | | |
|---|---|---|
| 6,624,624 B1 | 9/2003 | Karrer et al. |
| 2004/0140879 A1 | 7/2004 | Schafer |
| 2006/0176140 A1 | 8/2006 | Skendzic et al. |
| 2008/0007249 A1 | 1/2008 | Wilkerson et al. |

OTHER PUBLICATIONS

International Search Report (PCT/ISA/210) mailed on Jul. 30, 2013, by the European Patent Office as the International Searching Authority for International Application No. PCT/EP2013/001133.
International Search Report (PCT/ISA/210) mailed on Jul. 2, 2013, by the European Patent Office as the International Searching Authority for International Application No. PCT/EP2013/000916.
International Search Report (PCT/ISA/210) mailed on Jul. 23, 2013, by the European Patent Office as the International Searching Authority for International Application No. PCT/EP2013/000915.
Ramboz, "Machinable Rogowski Coil, Design, and Calibration", IEEE Transactions on Instrumentation and Measurement, Apr. 1, 1996, vol. 45, No. 2, pp. 511-515.
Saroj et al., "P4-13: Development and Calibration of of Rogowski Coils for Pulsed Power Systems", IEEE Vacuum Electronics Conference (IVEC), Feb. 21, 2011, pp. 471-472.

*Primary Examiner* — Walter L Lindsay, Jr.
*Assistant Examiner* — Jas Sanghera
(74) *Attorney, Agent, or Firm* — Taft Stettinius & Hollister LLP

(57) ABSTRACT

An exemplary method for calibrating a current transducer of the Rogowski type including a Rogowski coil sensor and an electronic device is performed by determining and correcting the sensitivity of the current transducer of the Rogowski type through the measurement of the self-inductance $L_{RCCT}$ of the coil using the electronic device.

15 Claims, 2 Drawing Sheets

METHOD FOR CALIBRATING A CURRENT TRANSDUCER OF THE ROGOWSKI TYPE

RELATED APPLICATION(S)

This application claims priority as a continuation application under 35 U.S.C. §120 to PCT/EP2013/001133, which was filed as an International Application on Apr. 17, 2013 designating the U.S., and which claims priority to European Applications' 12002766.9 filed in Europe on Apr. 20, 2012, 12002767.7 filed in Europe on Apr. 20, 2012 and 12004124.9 filed in Europe on May 29, 2012. The entire content of each prior application is hereby incorporated by reference.

FIELD

The present disclosure relates to a method for calibrating a current transducer of the Rogowski type, and a current transducer of the Rogowski type itself. Such a current transducer includes a Rogowski coil sensor and an electronic device.

BACKGROUND

In comparison to known current transducers (CT) with a ferromagnetic core, the Rogowski coil current transducers (RCCT) or sensors, exhibit higher dynamic range, lower weight and size, as well as lower production cost.

However, known RCCTs often have a moderate accuracy compared with highly accurate CT based current measurement solutions for metering applications. There have been various attempts to improve the Rogowski coil performance and associate it with advanced electronics to reach IEC60044-8 class 0.5 metering accuracy.

Known solutions for improving the accuracy of an RCCT are based on calibration techniques which provide for an interruption of the measurement or an additional reference sensor to measure the sensitivity of the Rogowski coil.

A first known solution is called "RCCT initial calibration in factory". Here, the Rogowski coils are calibrated in the factory. Their initial sensitivity as well as their temperature dependency are stored in an Electrically Erasable Programmable Read-Only Memory (EEPROM) inside the sensor housing. The intelligent electronic device (IED) uses this permanent, non-updated, information during the sensor lifetime to correct temperature induced sensitivity changes based on an additional temperature measurement.

Another known solution is called "RCCT calibration through precision potentiometer". Here the RCCT sensitivity drifts are compensated by re-calibrating and adjusting with a precision potentiometer that is connected to the coil.

Another known solution is called "RCCT calibration on a capacitive discharge rig". This solution provides a known voltage reference as well as an accurate capacitor in order to extract the sensitivity value. The measurement is based on the measurement of peak heights and the period of the ringdown oscillations. It can call for an offline calibration process.

In any of the aforementioned known calibration methods, a reference current measurement is specified, apart from discharge.

Another known solution is called "RCCT calibration by use of a reference Current Sensor". It differs from the calibration methods already discussed in how the correction is made. The reference sensor could for example be a shunt or any other sensor type. This option includes the comparison of the Rogowski coil output with the output of a reference CT or coil.

In still another known solution called "RCCT online self calibration with an additional winding combined with dedicated IED," an additional winding around the Rogowski coil is used to inject a reference current which will induce a reference voltage in the RCCT output signal in addition to the voltage proportional to the derivative of the rated current. This solution is good for self calibration and self diagnostic functions of RCCT+IED. However it calls for an additional winding, which can lead to additional RCCT manufacturing cost.

Among the areas of improvement of the known methods are for example unknown changes of the sensitivity S of Rogowski coils when the environmental conditions are changing, e.g. temperature, mechanical strain, humidity, effects of aging. Improvement with respect to in-factory calibration and diagnosis of the Rogowski coils is specified for implementing these improvements, which also means additional production cost. Another area of improvement can be found in the indication of damaged or out of accuracy class sensors during the coil lifetime, e.g., diagnostic and calibration functions, which is currently not available.

SUMMARY

An exemplary method for calibrating a current transducer of a Rogowski type using an arrangement including a Rogowski coil sensor and an electronic device is disclosed, the method comprising: determining and correcting a sensitivity of the current transducer of the Rogowski type by measuring a self-inductance $L_{RCCT}$ of a coil using the electronic device.

BRIEF DESCRIPTION OF THE DRAWINGS

The disclosure will be described in greater detail referring to the figures, wherein.

DETAILED DESCRIPTION

Figure 1:
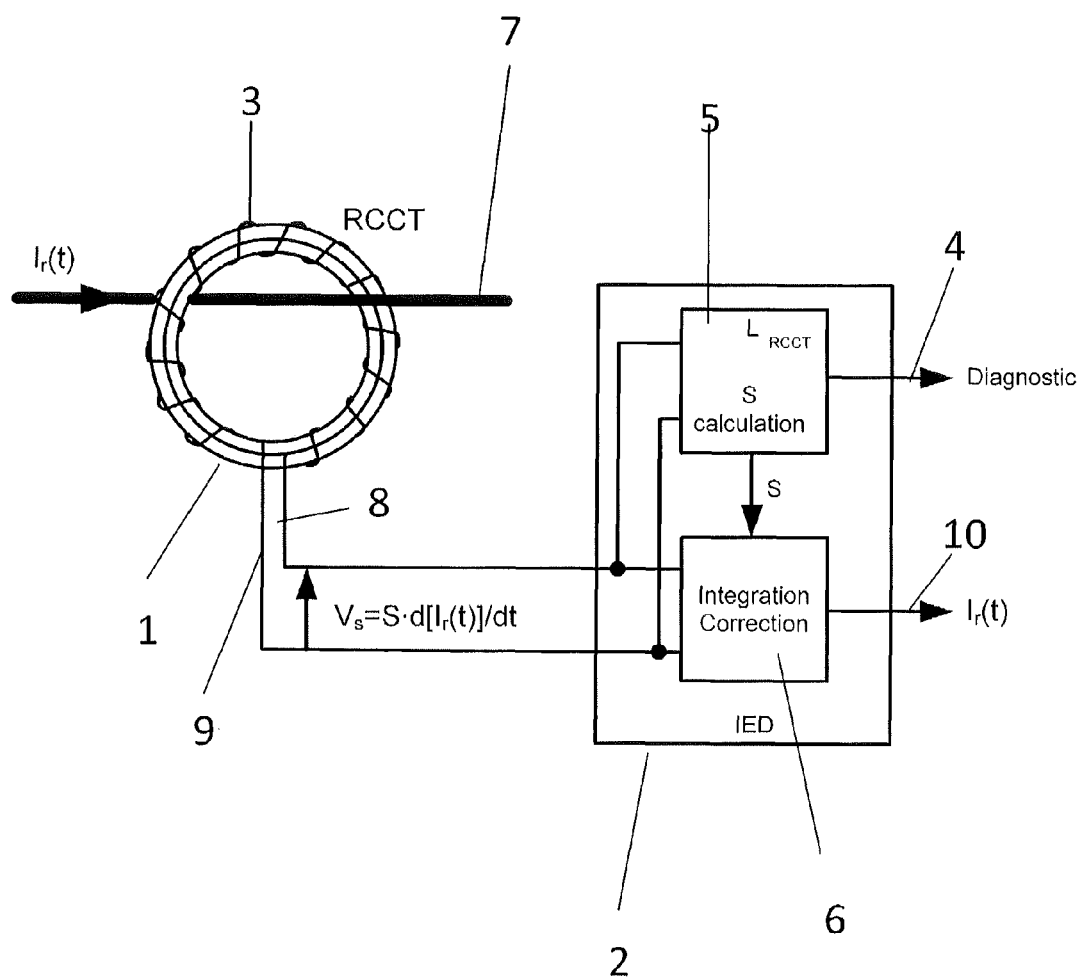
FIG. 1 shows a block diagram of a first IED and RCCT arrangement according to an exemplary embodiment of the present disclosure.

Exemplary embodiments of the present disclosure allow for combining protection and metering with a single RCCT and which can compete with known CT-based metering solutions.

The known problems are addressed according to an exemplary method for calibrating a current transducer of the Rogowski type, comprising (e.g., including) a Rogowski coil sensor and an electronic device, whereby the sensitivity of the current transducer of the Rogowski type is determined and corrected through the measurement of the self-inductance $L_{RCCT}$ of the coil using the electronic device.

According to an exemplary aspect of an exemplary embodiment of the present disclosure, the self-inductance is measured with a test current or a test voltage superimposed to the coil winding.

According to another exemplary feature of an exemplary embodiment of the present disclosure, the output voltage generated by the primary current to be measured with the coil sensor is measured simultaneously with the self-inductance of the coil of the current transducer of the Rogowski type.

According to a feature of an exemplary embodiment of the present disclosure, the self-inductance measurement is used to diagnose and calibrate the current transducer of the Rogowski type.

According to still another exemplary aspect of an exemplary embodiment of the disclosure, the self-inductance is measured through the response of the coil of the current transducer of the Rogowski type to a step voltage source which is connected in series with a known resistor.

According to an exemplary aspect of an exemplary embodiment of the disclosure, the self-inductance is measured by measuring the frequency response of the serial circuit of the coil of the current transducer of the Rogowski type and a known resistor by exciting the current transducer with AC signals of varying frequency.

Still another exemplary aspect an exemplary embodiment of the present disclosure, coil design parameters of the coil of the current transducer of the Rogowski type can be automatically detected by the electronic device.

An exemplary current transducer of the Rogowski type according to an exemplary embodiment of the disclosure, including a Rogowski coil sensor and an electronic device, wherein the electronic device is configured to perform the method for calibrating the current transducer as described above.

The exemplary method according to the present disclosure enables accuracy beyond the MVCS performances and to reach IEC60044-8 class 0.2 or better with Rogowski coil current transducers.

Using the exemplary method described herein allows for a sensitivity measurement method of Rogowski coils which allows the Intelligent Electronic Device (IED) a capacity to calibrate, calibrate continuously, and to diagnose the RCCT online, all without interrupting the rated current measurement. So it should be understood that exemplary embodiments of the present disclosure provide a Rogowski coil current transducer with an easier ability to calibrate the Rogowski coil sensitivity off-line as well as to calibrate the Rogowski coil sensitivity continuously online, without interrupting the rated current measurement.

The sensitivity S of an RCCT with constant winding density and cross-sectional area can be expressed as $$S_{RCCT} = \mu_0 \omega N_{RCCT} A_{RCCT} / l_{RCCT}$$

where, $\omega$ is the angular frequency of the respective current component, $N_{RCCT}$ the number of winding loops of the RCCT, $A_{RCCT}$ the cross sectional area of the coil, and $l_{RCCT}$ its length.

If there are any influences like thermal expansion of the coil carrier or its surroundings, swelling due to moisture intake or strain due to mechanical stress or ageing, which affect the geometrical dimensions ($A_{RCCT}$, $l_{RCCT}$) of the RCCT, this may change its sensitivity as well according to the preceeding equation.

The exemplary embodiments of the present disclosure provide an IED arrangement which precisely determines and corrects the sensitivity of a RCCT through the measurement of its self-inductance $L_{RCCT}$.

By knowing the number of loops of the RCCT, one can calculate the sensitivity $S_{RCCT}$ for the specified frequency w from the measured inductance value by using the relationship $$S_{RCCT} = \omega L_{RCCT} / N_{RCCT}$$

This equation can be shown to hold for coils which have a large enough constant winding density along their path and a fixed shape of the cross sectional area which is not twisted around but only moved along the path while staying always perpendicular to it. The validity of the equation does not depend on the specific shape or size of the cross sectional area or on the position of the primary conductor within the coil. This means that changes of the RCCT's sensitivity due to dimensional changes that do not violate the conditions mentioned above, can be fully reflected in the measured inductance and can be compensated with the appropriate scaling factor. This includes first order effects like homogeneous expansion or shrinking of the coil due to one of the discussed influences. Second order effects like local dimensional changes are not fully compensated, however, their influence on the sensitivity is expected to be much lower. Therefore, a compensation of sensitivity drift based on the measurement of the RCCT's self-inductance shall significantly improve the sensor accuracy.

FIG. 1 shows a block diagram of a first IED and RCCT arrangement according to an exemplary embodiment of the present disclosure. As shown in FIG. 1, a standard RCCT 1 which has a RCCT inductance $L_{RCCT}$ and is connected to an intelligent electronics device (IED) 2, which calculates and corrects the RCCT sensitivity S from a measurement of the RCCT inductance $L_{RCCT}$.

The primary conductor 7 carrying the current to be measured, which may be the rated current $i_R(t)$, passes through the center of a known Rogowski coil 1. Between the pair of secondary terminals 8, 9 of the secondary conductor winding 3 there is a rated current induced voltage signal $V_S$, which can be determined as $V_S = S \times d(i_R(t))/dt$, where S is the sensitivity of the Rogowski coil.

The IED 2 includes a measurement module 5 and a correction module 6.

The IED 2 is configured to measure the rated current induced voltage signal $V_S$.

The IED 2 is configured to superimpose a test current or voltage signal to the secondary conductor coil winding 3. In response to the derivative of the test current or voltage signal through the secondary conductor coil winding 3, the inductance $L_{RCCT}$ of the RCCT 1 is measured by the intelligent electronics device (IED) 2.

The IED 2 is further configured to calculate the RCCT sensitivity S through the measurement of the RCCT inductance $L_{RCCT}$.

The IED 2 then delivers an output value for the rated current $i_R(t)$ which is independent from changes of the RCCT sensitivity S via an output signal line 10.

Additionally, the IED 2 analyses the calculated S value provides an indication of the status of the RCCT by generating a diagnostic signal via a diagnostic signal line 4. Low manufacturing quality can thus be identified as well as non acceptable accuracy drift.

The IED 2 measures simultaneously the output voltage generated by the primary current and—with a test current or voltage superimposed to the coil winding—the inductance of the RCCT. The inductance measurement is then used to diagnose and calibrate the RCCT.

The exemplary methods and devices according to exemplary embodiments of the disclosure can avoid the need of in-factory calibration of the RCCT and therefore reduce the production cost.

The exemplary methods and devices according to exemplary embodiments of the present disclosure do not provide for any changes of known RCCT manufacturing processes, e.g. no additional winding and no additional connector.

The IED calculates the RCCT sensitivity S through a measurement of the RCCT inductance $L_{RCCT}$.

According to an exemplary embodiment of the present disclosure a method and device allows for the IED 2 to deliver an output value for the rated current $i_R(t)$ which is largely independent of the RCCT's sensitivity changes that can be induced by external influences, such as temperature, humidity, mechanical stress, and ageing, or any other influence as applicable.

According to yet another exemplary embodiment of the present disclosure a method and device allows for the IED 2 to detect if RCCT, cable and connectors are incorrectly manufactured, damaged or faultily connected by the customer during installation and lifetime. For this purpose, the IED 2 identifies sensitivity values which are out of range, e.g., sensitivity values that cannot be compensated by the correction module 6 (see FIG. 1). The IED 2 delivers then a diagnostic message via the diagnostic signal line 4.

Figure 2:
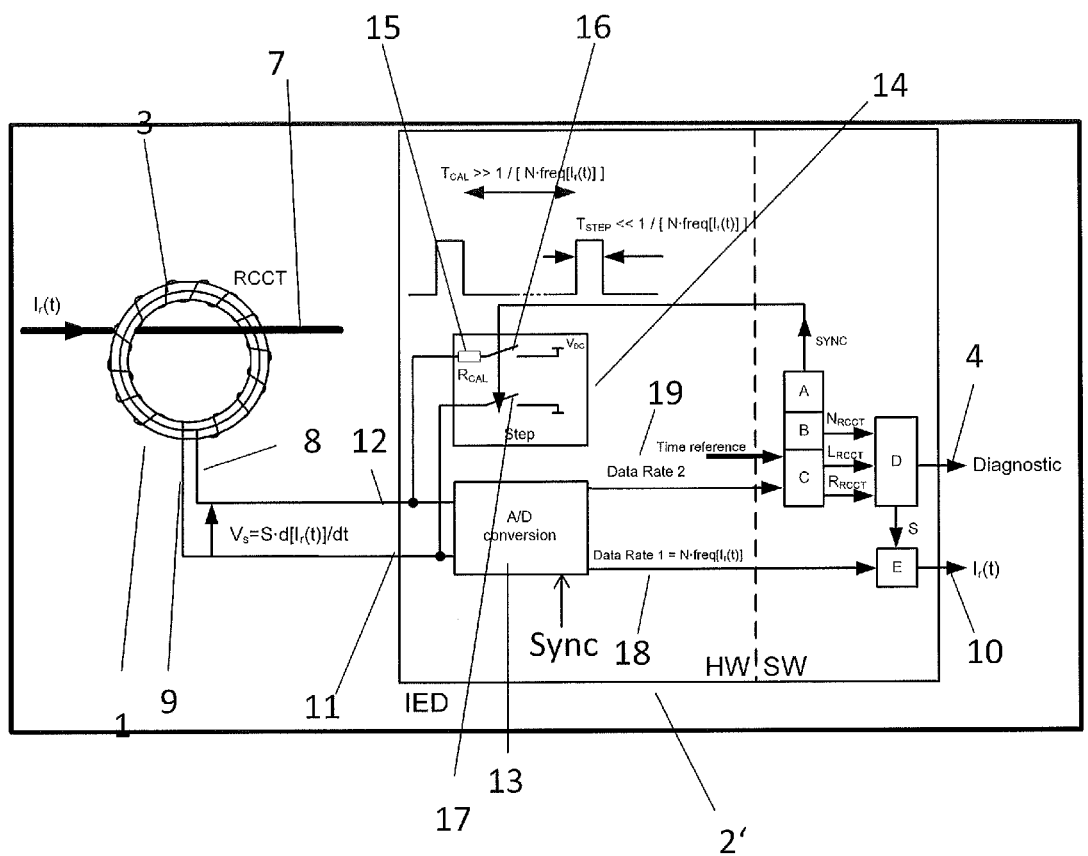
FIG. 2 shows a block diagram of a second IED and RCCT arrangement according to an exemplary embodiment of the present disclosure.

FIG. 2 shows a block diagram of a second IED and RCCT arrangement according to an exemplary embodiment of the present disclosure. As shown FIG. 2, the RCCT inductance $L_{RCCT}$ is measured through its step response.

The IED 2' of FIG. 2 includes an A/D conversion module 13, a voltage step generation module 14, and functional modules A, B, C, D, E. The IED 2' has a hardware domain including the A/D conversion module 13 and the voltage step generation module 14, and it has a software domain comprising the functional modules A, B, C, D, E.

The RCCT 1 is connected to the input terminals 11, 12 of the IED. In the hardware domain (HW) both an analog to digital conversion module 13 with a high input resistance, e.g. of several MOhm, and a voltage step generation module 14 are connected to these terminals 12, 13.

The step generation module 14 superimposes a continuous train of voltage pulses to the output voltage $V_S$ of the RCCT 1, and thereby induces a train of current pulses in its winding.

In order to obtain frequency separation from the primary current, the width of the voltage pulses should be much smaller than the sampling interval according to Data Rate 1 (see below). However, it should be larger than the time constant of the induced current pulses, which show an exponential behavior.

During the time the switches of the step generation module 14 are closed, there will be a distorted signal at the input of the IED 2, as a) an additional DC-voltage is applied and b) the output of the RCCT 1 is nearly short-circuited, which causes a voltage drop across the coil resistance $R_{RCCT}$. Therefore, the pulse train should have a very low duty cycle in order to limit resulting current errors at DC and at low frequencies.

The Step generation module 14 can be built with a simple low temperature coefficient resistor $R_{CAL}$ 15, a pair of switches 16, 17 (e.g., analog CMOS switches), and a DC voltage source. $R_{CAL}$ measures the current pulses generated by the step voltage and it has a low ohmic value in the order of magnitude of the RCCT resistance $R_{RCCT}$. Its value can be used to control the amplitude and the time constant of the current signal.

The A/D conversion module 13 can generate two data streams from the total RCCT output voltage $V_S$ which have different data rates, namely Data Rate 1 (18) and Data Rate 2 (19). To do so, a single sigma delta converter with a high sampling rate and two different digital decimation filters can be implemented.

As a time reference either an accurate embedded oscillator or an oscillator controlled by an external reference oscillator such as a GPS clock (e.g. pulse per second PPS clock) can be used.

Data Rate 1 is chosen to satisfy the specifications for sampling the rated current $I_r(t)$, which can include, for example, 80 or 256 samples per period, as described in IEC 60044-8. In this data stream the step response signal has been filtered out because its frequency is higher than the decimation filter cutoff frequency.

Data Rate 2 can be chosen to be much higher than Data Rate 1. In this manner the step response of the RCCT 1 is measurable in the digital data stream. However, Data Rate 2 does not necessarily have to be higher than Data Rate 1.

Software (SW) Module A applies the appropriate control signals to the switches. A voltage step is applied by closing the switches in order to generate a current pulse. From the measured shape of this pulse, module C will determine the self-inductance $L_{RCCT}$ and the coil resistance $R_{RCCT}$. As soon as the step response evaluation is performed, module A opens the switch so that the RCCT 1 is connected exclusively to the A/D conversion unit 13.

SW module B contains the number of loops $N_{RCCT}$ of the RCCT. Alternatively module B can read this information from an EEPROM memory located in the RCCT 1 casing, which contains the RCCT 1 parameters such as $N_{RCCT}$.

Module C evaluates the resistance $R_{RCCT}$ and the inductance $L_{RCCT}$ of the RCCT 1. It is important to note that the accuracy of $L_{RCCT}$ evaluation depends only on $R_{CAL}$ accuracy and time reference accuracy. All parasitic capacitance and stray inductance due to cables, winding, Printed Circuit Board (PCB) or connectors are made negligible by analyzing the step response during its mostly inductive behavior. The accuracy of $R_{RCCT}$ evaluation depends only on $R_{CAL}$. This represents a significant difference between the disclosure and prior art, where the sensitivity estimation accuracy depends on time reference and resistors accuracy but also on voltage and capacitor values.

Module D calculates the actual sensitivity S of the RCCT according to the equation given above. This value is regularly updated to compensate for external perturbations acting on the RCCT (e.g. temperature, ageing, humidity, mechanical stress). Additionally, module D can be used to analyze if the sensitivity or other parameters are within an acceptable range defined according to the application. If this is not the case a diagnostic message can be generated via diagnostic signal line 4 to inform that maintenance has to be performed on the installation.

Module E reads the calculated value of S and corrects the RCCT's 1 output signal according to the specified sensitivity of sensor. In this way the accuracy of the digital output $I_r(t)$ is increased and it becomes independent of any sensitivity variations of the primary sensor.

In the following, some variations of the embodiment shown in FIG. 2 are described.

In order to limit voltage peaks induced during the opening of the switches of the step voltage unit, a voltage limiting device (Zener diode, etc.) can be connected across the IED-input terminals.

As an alternative to using a unipolar step voltage with a very low duty cycle, a bipolar pulse train with a duty cycle close to 50% can be used by reversing the polarity of the DC-voltage with the two switches. In this case a low pass filter (e.g. based on a capacitor) should be put in series with the switches in order to prevent the output of the RCCT from being short-circuited. Its cut-off frequency needs to be well between the rated current frequency and the frequency of the pulse train. In this way DC- and low frequency components would be avoided and there would be no need for a voltage limiting device.

If the RCCT needs to be connected to the IED with long cables, the cable impedances may affect the accuracy of the sensitivity calibration at the high measurement frequency. In order to compensate for parasitic impedances, a four-terminal sensing technique may be applied if two more wires are available in the cable. In this case each of the coil terminals will be connected with two wires, of which one is used for the application of the step voltage (this circuit contains the resistor $R_{CAL}$) and the other one for the measurement of the voltage across the coil. This method could be applied with each of the aforementioned variations (low or high duty cycle).

According to another exemplary embodiment, concerns the measurement of RCCT inductance through its frequency response. In this exemplary embodiment, the module Step (see FIG. 2) can be replaced by another module X (not shown in the figures), generating an oscillating (e.g. square, sinusoidal) signal of precisely known frequency (i.e. controlled by Time reference or external clock). The module C shall in this embodiment analyze the frequency response by identifying the amplitude and the phase of the current with respect to the voltage and the cutoff frequency while a frequency sweep is applied by module A to module X. The cutoff frequency can be found by analyzing the amplitude of the data delivered at Data Rate 2.

Similar to the embodiment above, the excitation of the coil by module X through a resistor $R_{CAL}$ is filtered out from Data Rate 1 by the A/D conversion low pass digital decimation filter.

The main features of the disclosure are again summarized below.

The exemplary embodiments of the present disclosure include an IED arrangement that measures the Rogowski coil inductance and calculates the coil sensitivity. Since the Rogowski coil design connected to the IED is predetermined or automatically detected (EEPROM, connector configuration, coil resistivity etc . . . ), the IED knows the number of loops in the coil and can calculate the sensitivity from the measured inductance.

The IED performs in parallel the sensitivity estimation and the rated current measurement.

In this manner the sensitivity value is constantly updated by the IED so that it compensates the sensitivity changes due to temperature, mechanical stress, humidity or aging.

This latter IED capability avoids in-factory calibration and temperature characterization of the sensor.

With the same principle the IED can perform diagnostics to detect damaged sensors, cables or connectors, but also wrong connections or out of range drifts appearing during installation and lifetime.

The exemplary embodiments described herein can be used to measure the inductance through the step response of the coil which is connected in series with a known resistor located in the IED (we then have a RL circuit).

In one exemplary embodiment the frequency response of the RL circuit can be measured by exiting the sensor with varying frequency AC signals.

The exemplary embodiments of the present disclosure enable the realization of a Rogowski current sensor that is more accurate (IEC class 0.2 or better) than known designs, makes the Rogowski coil manufacturing process cheaper because it avoids in-factory calibration and temperature characterization, can be implemented with low cost electronics comparable to existing IED, increases the sensor lifetime and adds some diagnostic function to detect wrong installation, damage, or out of range drifts.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SIGNS

1 RCCT coil sensor
2, 2' intelligent electronic device IED
3 secondary conductor winding
4 diagnostic signal line
5 measurement circuit
6 correction circuit
7 primary conductor
8 secondary terminal
9 secondary terminal
10 output signal line
11 input terminal
12 input terminal
13 A/D conversion module
14 voltage step generation module
15 resistor
16 switch
17 switch
18 data rate 1
19 data rate 2
A functional module
B functional module
C functional module
D functional module
E functional module

What is claimed is:

1. A method for calibrating a current transducer of a Rogowski type using an arrangement including a Rogowski coil sensor and an electronic device, the method comprising:
determining and correcting a sensitivity of the current transducer of the Rogowski type by measuring a self-inductance $L_{RCCT}$ of a coil using the electronic device.

2. The method according to claim 1, wherein the self-inductance is measured with a test current or a test voltage superimposed to a coil winding.

3. The method according to claim 2, wherein an output voltage generated by a primary current to be measured with the coil sensor is measured simultaneously with the self-inductance of the coil of the current transducer of the Rogowski type.

4. The method according to claim 3, wherein the self-inductance measurement is used to diagnose and calibrate the current transducer of the Rogowski type.

5. The method according to claim 4, wherein coil design parameters of the coil of the current transducer of the Rogowski type are automatically detected by the electronic device.

6. The method according to claim 3, wherein the self-inductance is measured through a response of the coil of the current transducer of the Rogowski type to a step voltage source which is connected in series with a resistor.

7. The method according to claim 6, wherein coil design parameters of the coil of the current transducer of the Rogowski type are automatically detected by the electronic device.

8. The method according to claim 3, wherein the self-inductance is measured by measuring a frequency response of a serial circuit of the coil of the current transducer of the Rogowski type and a resistor by exciting the current transducer with AC signals of varying frequency.

9. The method according to claim 8, wherein coil design parameters of the coil of the current transducer of the Rogowski type are automatically detected by the electronic device.

10. The method according to claim 3, wherein coil design parameters of the coil of the current transducer of the Rogowski type are automatically detected by the electronic device.

11. The method according to claim 2, wherein coil design parameters of the coil of the current transducer of the Rogowski type are automatically detected by the electronic device.

12. The method according to claim 1, wherein coil design parameters of the coil of the current transducer of the Rogowski type are automatically detected by the electronic device.

13. A method for performing diagnostics on a current transducer of a Rogowski type, the current transducer having a Rogowski coil sensor and a electronic device, the method comprising:
    calibrating the current transducer according to claim 1.

14. A current transducer of a Rogowski type, comprising:
    a Rogowski coil sensor; and
    an electronic device,
    wherein the electronic device is configured to perform a method for calibrating the current transducer according to claim 1.

15. A current transducer of a Rogowski type, comprising:
    a Rogowski coil sensor; and
    an electronic device,
    wherein the electronic device is configured to perform a method for performing diagnostics on a current transducer according to claim 13.

\* \* \* \* \*